United States Patent
Chang et al.

[11] Patent Number: 6,166,400
[45] Date of Patent: Dec. 26, 2000

[54] THIN FILM TRANSISTOR OF LIQUID CRYSTAL DISPLAY WITH AMORPHOUS SILICON ACTIVE LAYER AND AMORPHOUS DIAMOND OHMIC CONTACT LAYERS

[75] Inventors: Park Kyu Chang, Seoul; Seo Kuk Jin, Songnam, both of Rep. of Korea

[73] Assignee: Hyundai Electronics Industries Co., Ltd., Kyoungki-do, Rep. of Korea

[21] Appl. No.: 09/105,871

[22] Filed: Jun. 26, 1998

[30] Foreign Application Priority Data

Jun. 30, 1997 [KR] Rep. of Korea ............. 97-30428

[51] Int. Cl.[7] ............. H01L 31/0312; H01L 29/786
[52] U.S. Cl. ............. 257/77; 257/59; 257/57; 257/72; 257/63
[58] Field of Search ............. 257/77, 55, 63, 257/72, 59, 57

[56] References Cited

U.S. PATENT DOCUMENTS 5,474,816  12/1995  Falabella ............. 427/580
5,633,513   5/1997  Koyama ............. 257/77

FOREIGN PATENT DOCUMENTS 9425033  11/1994  Rep. of Korea .
9528191  10/1995  Rep. of Korea .

*Primary Examiner*—Jerome Jackson, Jr.
*Attorney, Agent, or Firm*—Selitto & Associates

[57] ABSTRACT

In thin film transistor, an amorphous diamond is used as an ohmic layer formed between an active layer and a source and drain electrodes. Specifically, in a inverse staggered type thin film transistor, a gate electrode and a gate insulating layer are formed on an insulating substrate. On the gate insulating layer is formed an active layer. An etch stopper is formed on the active layer, overlapping with the gate electrode. Thereafter, an amorphous diamond is overlappingly formed on the gate electrode on a resultant structure and then a metal layer is formed on the resultant in which the ohmic layer is formed. The metal layer and the amorphous diamond layer is patterned until the etch stopper is exposed, forming the ohmic layer and a source electrode and a drain electrode.

2 Claims, 2 Drawing Sheets

THIN FILM TRANSISTOR OF LIQUID CRYSTAL DISPLAY WITH AMORPHOUS SILICON ACTIVE LAYER AND AMORPHOUS DIAMOND OHMIC CONTACT LAYERS

BACKGROUND OF THE INVENTION

1. Field of the Invention

The present invention relates to an liquid crystal display (LCD), and more particularly to a LCD having an ohmic layer made of an amorphous diamond.

2. Related Art

Thin film transistors (TFTs) generally used as a switching device, are classified into a staggered type, an inverse staggered type and a coplanar type. The staggered type and the inverse staggered type have a gate electrode below which an active layer is formed and a source electrode and a drain electrode formed on the active layer. The coplanar type TFT has a gate electrode and a source electrode and a drain electrode which all are formed on an active layer. The active layer ohmic layer is made from an amorphous silicon, poly silicon or compound such as CdSe. Among them, a TFT using hydrogenated amorphous silicon has a benefit in respect to a production yield and a large area, so the hydrogenated amorphous silicon is widely employed in the active layer and the ohmic layer.

Since the hydrogenated amorphous silicon(a-Si:H) has a low electric field mobility and a high optical-electrical conductivity, that is, a-Si:H is unstable in light and in an electric field, the hydrogenated amorphous silicon TFT has a large leakage current. Also, since the ohmic layer composed of the hydrogenated amorphous silicon has low conductivity, the a-Si:H TFT has a low on-current and a high off-current.

On the other hand, for reducing the leakage current, methods have been proposed for manufacturing a self-aligned or completely self-aligned a-Si:H TFT or for reducing the thickness of the a-Si:H layer. The completely self-aligned a-Si:H TFT has low electric field mobility, and the process for reducing the thickness of the a-Si:H layer is practically difficult.

Accordingly, there is a need for a TFT improving an on-current feature and reducing a leakage current, without reducing the thickness of the ohmic layer and forming a self-aligned a-Si:H TFT.

SUMMARY OF THE INVENTION

Accordingly, an aim of a present invention is to provide a thin film transistor having an improved on-current feature and an reduced leakage current and a method of for making same.

In order to accomplish the aim of the present invention, an amorphous diamond is used as an ohmic layer formed between an active layer and source an drain electrodes.

In detail, in an inverse staggered type thin film transistor, a gate electrode and a gate insulating layer are formed on an insulating substrate. On the gate insulating layer is formed an active layer. An etch stopper is formed on the active layer, overlapping with gate electrode. Thereafter, an amorphous diamond is overlappingly formed on the gate electrode on the resultant structure, and then a metal layer is formed on the resultant in which the etch stopper is formed. The metal layer and the amorphous diamond layer are patterned until the etch stopper is exposed, forming an ohmic layer and a source electrode and a drain electrode.

Since the amorphous diamond is used in the ohmic layer of the TFT, the on-current feature of the TFT is improved.

The leakage current, in the a-Si:H TFT is derived from the holes. The amorphous diamond has a lower active energy than that of N+ hydrogenated amorphous silicon which were used in the ohmic layer. Accordingly, the number of electrodes having a conduction energy near the Fermi level is increased and the electrons are recombined with holes, thereby dramatically reducing the leakage current.

BRIEF DESCRIPTION OF THE ATTACHED DRAWINGS

DESCRIPTION OF THE PRESENT INVENTION

Figure 1:
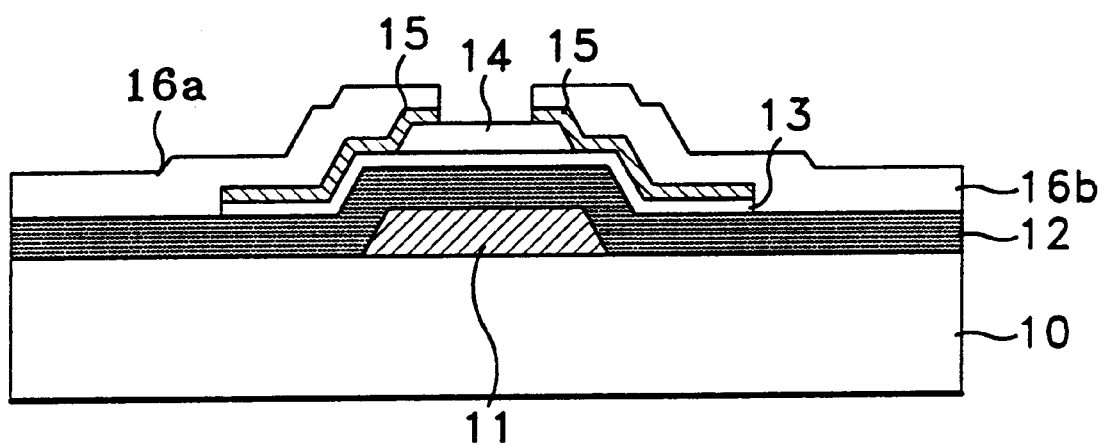
FIG. 1 is a view showing a section of a present inverse staggered thin film transistor.

FIG. 1 is a cross-sectional view of an inverse staggered thin film transistor.

A gate electrode 11 is formed by depositing Cr or Al on an insulating layer 10, and then the deposited is patterned. The gate electrode 11 is tapered, so a step coverage of the succeeding layers is improved. An insulating layer 12 composed of $SiO_2$, SiON or $SiN_x$ or a composition thereof, is formed on the substage having the gate electrode 11. Then, an a-Si:H layer is formed on the gate insulating layer 12 by using $SiH_4$ or $Si_3H_8$ through a plasma enhanced chemical vapor deposition. The a-Si:H layer is patterned, forming an active layer 13. On the active layer 13, is formed an etch stopper 14 overlapping the gate electrode. An amorphous diamond and a metal are deposited on the resultant substrate in which the etch stopper is formed. Then the substrate is subjected to etching to expose etch stopper 14, forming an ohmic layer 15 and a source electrode and a drain electrode (16a and 16b). The amorphous diamond layer is formed by using $CH_4$ or $C_2H_2$ through plasma enhanced chemical vapor deposition.

Although among various TFTs FIG. 1 illustrates an inverse staggered TFT, the present invention is not limited to the illustrated TFT. The amorphous diamond can be applied to ohmic layers of an inverse etch back TFT, a staggered TFT and a coplanar TFT.

Figure 2:
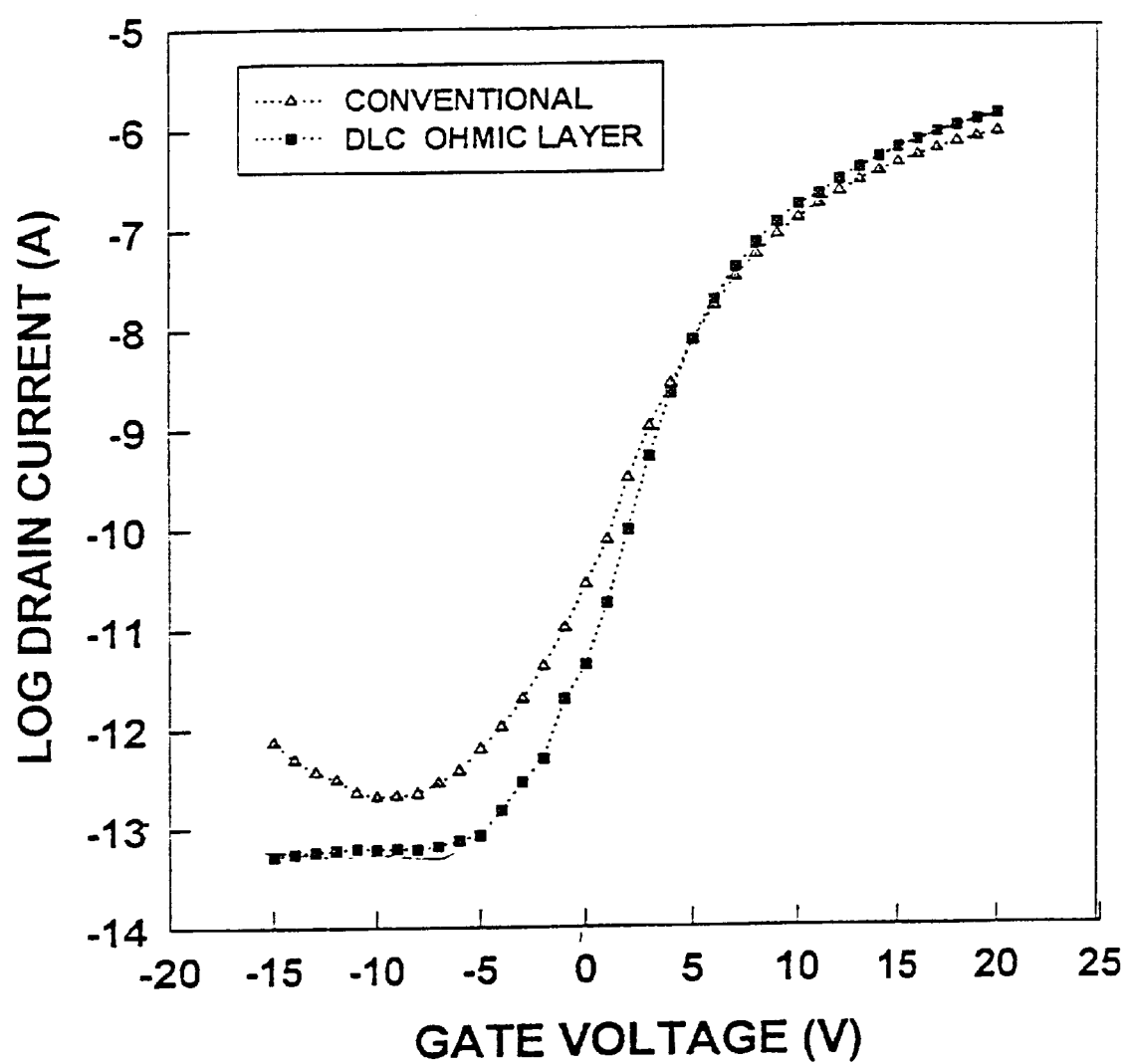
FIG. 2 is a graph illustrating the current feature of the thin film transistor according to the present invention.

FIG. 2 is a graph showing the current characteristic of a TFT using an amorphous diamond as an ohmic layer.

The on-current of the TFT according to the present invention, is larger than conventional TFTs using an a-Si:H layer as an ohmic layer, and the off-current of the present TFTs is smaller than conventional TFT. That is, we can recognized that the on-current feature of the present TFT is improved, and the leakage current of the present TFT is reduced.

What is claimed is:

1. A thin film transistor of a liquid crystal display comprising:
    a substrate;
    an active layer formed on said substrate and made from a hydrogenated amorphous silicon;
    a source electrode and a drain electrode formed on said substrate; and
    an ohmic layer formed between said active layer and said source and drain electrodes, said ohmic layer made of amorphous diamond.

2. The thin film transistor as claimed in claim 1, further comprising: a gate electrode formed below said active layer and wherein said source electrode and said drain electrode are at least partially formed above said active layer.

* * * * *

UNITED STATES PATENT AND TRADEMARK OFFICE
CERTIFICATE OF CORRECTION

PATENT NO. : 6,166,400
DATED : December 26, 2000
INVENTOR(S) : Kyu Chang Park and Kuk Jin Seo It is certified that error appears in the above-identified patent and that said Letters Patent is hereby corrected as shown below:

<u>Title page,</u>
Item [75], the names of the inventors should read:
-- Kyu Chang Park -- and -- Kuk Jin Seo --

Signed and Sealed this

Twenty-eighth Day of October, 2003

JAMES E. ROGAN
*Director of the United States Patent and Trademark Office*